United States Patent [19]
Gupta

[11] 4,354,164
[45] Oct. 12, 1982

[54] DIGITAL PHASE LOCK LOOP FOR TIM FREQUENCY

[75] Inventor: Shanti S. Gupta, Gaithersburg, Md.

[73] Assignee: Communications Satellite Corporation, Washington, D.C.

[21] Appl. No.: 79,671

[22] Filed: Sep. 27, 1979

[51] Int. Cl.³ .............................................. H03L 7/08
[52] U.S. Cl. ..................... 331/1 A; 328/133; 328/155; 331/14; 331/16; 331/25
[58] Field of Search ...................... 331/1 A, 14, 16, 18, 331/25; 328/133, 134, 155

[56] References Cited
U.S. PATENT DOCUMENTS

| | | | |
|---|---|---|---|
| 3,731,219 | 5/1973 | Mader et al. | 331/25 X |
| 3,983,498 | 9/1976 | Malek | 328/155 |
| 4,024,460 | 5/1977 | Vifiau | 328/155 |
| 4,105,947 | 8/1978 | Crowley | 331/1 A |

Primary Examiner—Siegfried H. Grimm
Attorney, Agent, or Firm—Sughrue, Mion, Zinn, Macpeak & Seas

[57] ABSTRACT

A phase lock loop for a frequency synthesizer operating by counting different frequencies to a common fixed number to generate different time bases. An error signal is generated by counting bits of a first frequency over a given count relative to bits received at a second reference frequency. If an error occurs, a programmed frequency change takes place, otherwise the synthesizer is maintained at the programmed center frequency. Error detection resumes with a new counting period determined by the programmed change.

8 Claims, 5 Drawing Figures

DIGITAL PHASE LOCK LOOP FOR TIM FREQUENCY

BACKGROUND OF THE INVENTION

This invention is related to my co-pending application entitled, "High Resolution Frequency Synthesizer", Ser. No. 79,603, filed on Sept. 27, 1979. In particular, this invention is directed to a phase lock loop applicable to the frequency synthesis techniques disclosed in that co-pending application. In my co-pending patent application, a system is disclosed having a center frequency and a programmable finite pull-in and holding range. The pull-in and holding range is the same and requires no filters.

In conventional phase lock loop circuitry (PLL), pull-in and holding ranges are different. Therefore, such circuitry generally requires the use of filters within the loop. The present invention removes such a requirement.

In the co-pending application, the reference oscillator and clock filter are not affected in the circuitry. Accordingly, there are multiple phase lock loops on the same reference clock without affecting each other and they may be maintained in an edge synchronous manner to the reference clock frequency. Accordingly, the jitter and the output frequency remain the same over the entire PLL range. It is of course a function of the reference clock frequency. This is contrasted with standard PLL technology where jitter becomes extremely large with large frequency division.

As a result, resolution can be controlled within very narrow limits even when the ratio of the output frequency to the synchronization frequency is at extremes, whether they be large or small. Moreover, a known time base repetitive pulse may be used for alignment of frequency even when the ratio of frequency to time base pulse is exceptionally large. Such technique is useful in time division multiple access (TDMA) applications where a large frame length is used and a large number of frequencies must be adjusted due to doppler effect of satellite movement and the stability of the reference frequency.

SUMMARY OF THE INVENTION

This invention pertains specifically to the phase lock loop aspects of such frequency synthesizers and is based on the concept that when different frequencies are counted to a fixed number, on a repetitive basis, they will generate a different time base. Conversely, the number of bits over a fixed time base is different for different frequencies. These two principles are used in this invention for the development of the phase lock loop. The error is detected at the end of the count and a programmed frequency change then takes place if there is an error. Otherwise, the synthesizer is kept at the programmed center frequency. This technique of error detection is used at the end of each count.

This invention will be described in greater detail with respect to the accompanying drawings and the description of the preferred embodiment which follow.

DESCRIPTION OF THE PREFERRED EMBODIMENT

Figure 1:
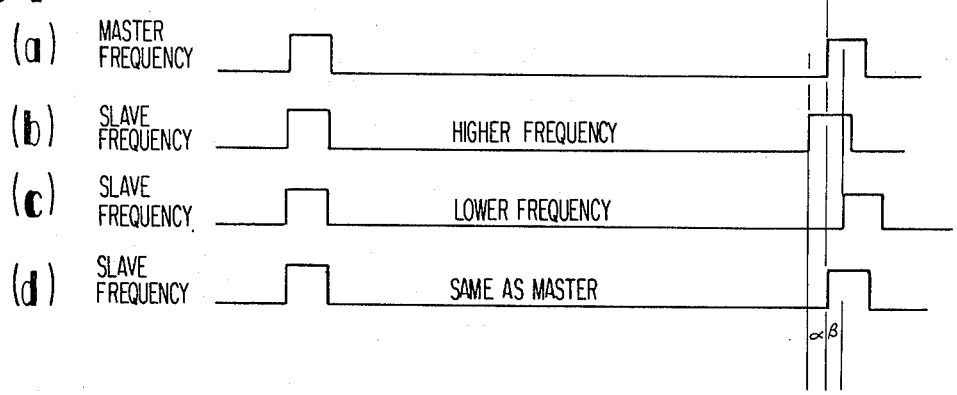
FIG. 1 is a waveform diagram showing a first case where two frequencies are available: one, a master clock frequency and the other a slave frequency.
Figure 2:
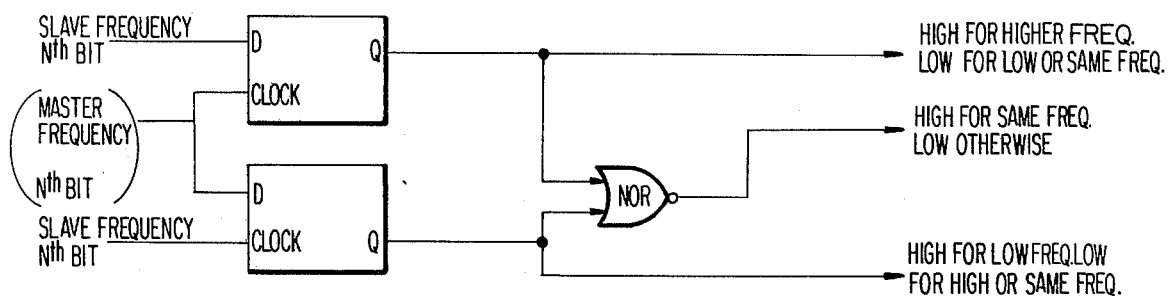
FIG. 2 is a block diagram showing details of the frequency change monitor and relates this invention to the FIG. 1 timing diagram.

Referring now to FIGS. 1 and 2, a first case is shown where two frequencies are available, one being a master clock frequency and the other being a slave or output frequency. As shown in FIG. 1, the master frequency is shown as curve (a) and the slave frequency is shown in three cases as (b), (c) and (d). In particular, in the second curve (b), the slave frequency is a higher frequency than that of the master frequency and in the second case (c) the slave frequency is a lower frequency than that of the master frequency. Finally, in the waveform (d) the slave frequency and the master frequency are the same. Accordingly, all three cases are covered vis-a-vis frequency variation in the first case. As shown in FIG. 1, the frequency different between the curves (a) and (b) is $\alpha$, and in the case between the master and the lower frequency (c), the difference is shown as $\beta$.

The slave frequency is generated utilizing digital synthesizer techniques as disclosed in my co-pending application. The two frequencies are applied to two different counters which are each set to count to a number N.

The Nth bit of the desired frequency is used for a loading that is synchronization of the slave frequency counter. Using the principles of this invention, of the generation of different time bases by two different frequencies, the Nth bit of the master and slave frequencies are compared to generate the correction program for feedback change in frequency. This correction program feedback will change the number $N_k$ as described in my co-pending application. To the extent that the disclosure on the derivation of $N_k$ is needed, the following discussion is presented to explain the function of $N_k$ in the context of the frequency synthesizer of my co-pending application. Assume that the acceptable jitter in the TDMA TIM clock frequency is A nanosecond. The lowest reference clock frequency cy $f_S$ is:

$$f_S = 1/A \text{ MHz} \tag{1}$$

Let the desired TDMA TIM frequency be $f_D$.

$$\text{Ratio of two frequencies } N = f_S/f_D \tag{2}$$

Let $$N = N_E + N_R \tag{3}$$

where, $N_E$ = Even number, preferably highest, but cannot be more than N, and $N_R$ = Remainder; can be whole or fraction, but cannot be negative.

From equations (2) and (3), $$f_S/f_D = N_E + N_R \qquad (4)$$

or $$f_S = N_E f_D + N_R f_D \qquad (5)$$

let $$N_E f_D = f_x \qquad (6)$$

or $$N_R f_D = f_S - f_x$$

where, $f_x$ = frequency or number of bits per second which is an even multiple of desired frequency, and $N_R f_D$ = Difference of bits per second between master and $f_x$.

Divide equation (5) by $N_R f_D$ $$(f_S)/(N_R f_D) = (N_E f_D)/(N_R f_D) + 1 \qquad (7)$$
$$= [(N_E + N_R)f_D]/N_R f_D = N/N_R = N_K$$
$$N_R f_D = f_S/N_K \qquad (8)$$

Let $N_{KH1}$ = first higher whole number to $N_K$,
$N_{KL1}$ = first lower whole number to $N_K$,
$N_{KH2} = (N_{KH1}+1)$,
$N_{KL2} = (N_{KL1}-1)$
and so on.
$Q_{H1}$ = multiplier of $N_{KH1}$
$Q_{H2}$ = multiplier of $N_{KH2}$
$Q_{L1}$ = multiplier of $N_{KL1}$
$Q_{L2}$ = multiplier of $N_{KL2}$
and so on. Let $$N_K = \frac{N_{KH1}Q_{H1} + N_{KL1}Q_{L1} + N_{KH2}Q_{H2} + N_{KL2}Q_{L2} + \cdots}{Q_{H1} + Q_{L1} + Q_{H2} + Q_{L2}}$$

or $$N_K = \frac{\sum_{p=1}^{r}(N_{KHp}Q_{Hp} + N_{KLp}Q_{Lp})}{\sum_{p=1}^{r}(Q_{Hp} + Q_{Lp})}$$

FIG. 2 shows the frequency change monitor 24. In the Figure, two flip flops and a standard NOR circuit are shown. These components generate three logic correction signals, as will be discussed later, which provide control information to divider 12, shown in FIG. 3. As noted in FIG. 2 which shows the frequency change monitor, three outputs would be obtained, a higher frequency, a lower frequency and the same frequency. These three outputs are then fit into a program to change or keep the same value of $N_k$ for the frequency. Therefore, a block diagram of the phase lock loop in accordance with this invention is shown in FIG. 3.

Figure 3:
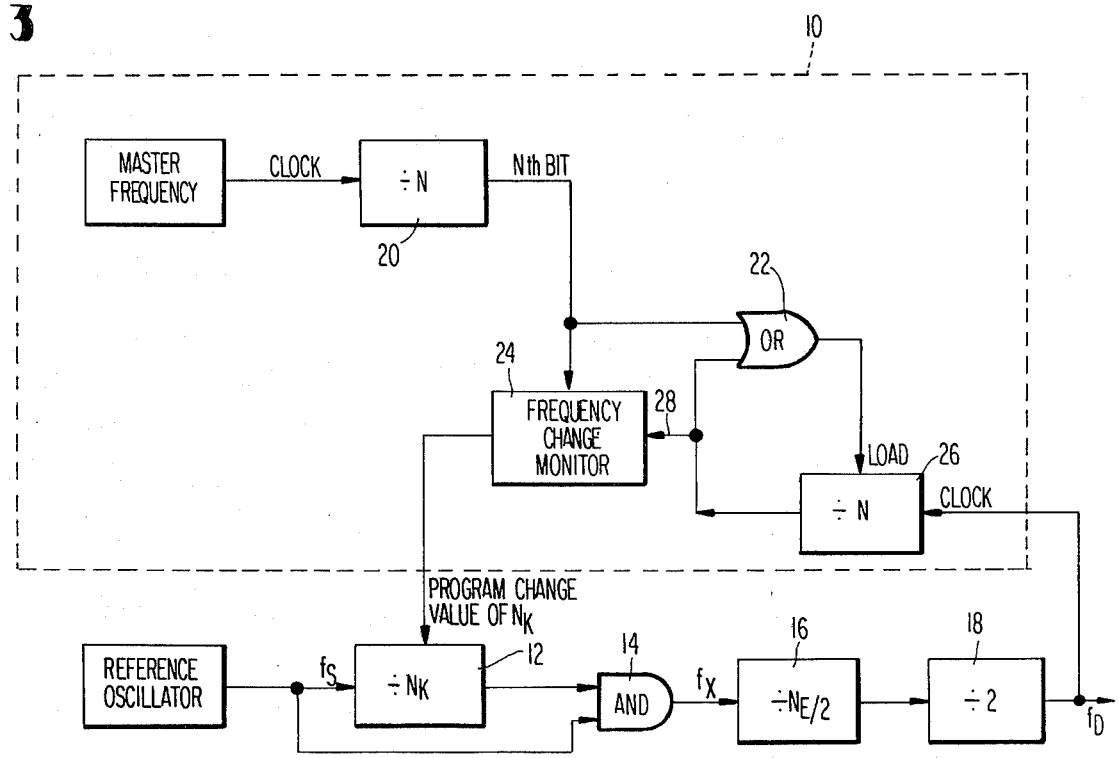
FIG. 3 is a block diagram showing a phase locked loop in accordance with this invention.

FIG. 3 shows the phase lock loop circuit aspects of this invention in the dotted box 10. The remaining portions of the block diagram in FIG. 3 comprise the frequency synthesizer as described in my co-pending application. That is, as described in that application, a reference oscillator supplies the signal at frequency $f_S$ to the divider 12 for division by $N_k$. The reference frequency and the divider signal are then supplied to the AND gate 14 which provides an output $f_x$ which is fed to a second divider 16 for division by the value $N_E$ divided by 2. Finally, to obtain a symmetrical waveform, the resulting signal is divided by 2 in divider 8 to produce the final desired signal $F_D$. In accordance with this invention, a phase lock loop 10 is used to define a program change for the value of $N_k$. The master frequency in the form of clock pulses is provided to the counter 20 for division by N. The counter is loaded with the Nth bit as shown to count to N. The output of counter 20 is fed to gate 22 and a frequency change monitor 24 the details of which are shown in FIG. 2. Gate 22 is used to provide a load signal for a second counter 26, supplying a feedback signal to the gate 22 and the frequency change monitor 24.

As a result, as shown in FIG. 3, the master frequency is counted to the set count N in counter 20 providing a first input to the frequency change monitor 24 in the form of the Nth bit of the master frequency. The Nth bit of the slave frequency provides a second input to the frequency change monitor along line 28. This Nth bit is also supplied as an output to the OR gate 22 which is used to load the counter 26. The counter 26 receives the synthesized output $f_D$ as the feedback input to the loop.

Consequently, the frequency change monitor receives the Nth bits of both the master and slave frequencies to compare them and generate the correction program for the feedback change in frequency to the divider $N_k$. The frequency change monitor 24 essentially comprises 2 flip-flops having a synchronizing pulse input coupled to the cl inputs such as in a MC10131 f-f which is depicted at page 3-35 in the 1978 MOTOROLA MECL Integrated Circuits handbook. The second input from the divider 26 is supplied to the SD terminals of such f-f elements.

The outputs of the two flip-flops are used in combination with the output of a standard NOR gate to provide three logic correction signals to control the value $N_k$ of divider 12. A first control signal taken from the output of the first flip-flop will be high if the synchronizing pulse is at a higher frequency than the Nth pulse. Conversely, this control signal will be low where the synchronizing pulse is lower than, or at the same frequency as the Nth pulse. A second control signal is taken from the output of the NOR gate and will be high when the synchronizing pulse is the same frequency as the Nth pulse and low otherwise. A third control signal is taken from the output of the second flip-flop and will be high when the synchronizing pulse is lower than the frequency of the Nth pulse and will be low when the synchronizing pulse is higher than, or the same as the frequency of the Nth pulse.

Figure 4:
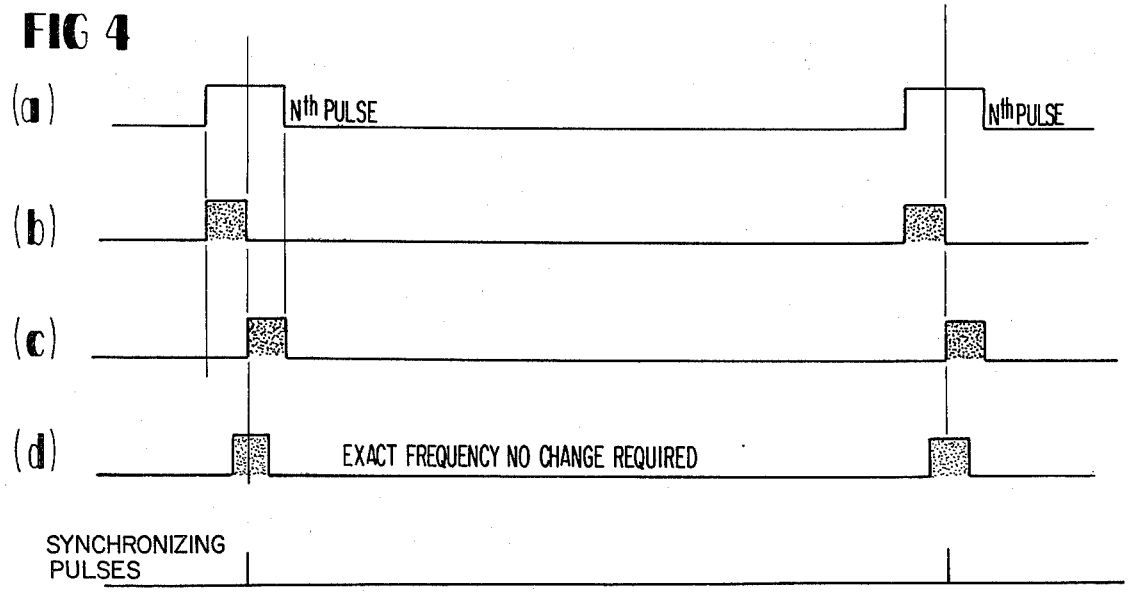
FIG. 4 is a timing diagram showing a second case where a synchronizing pulse appears after a fixed interval.
Figure 5:
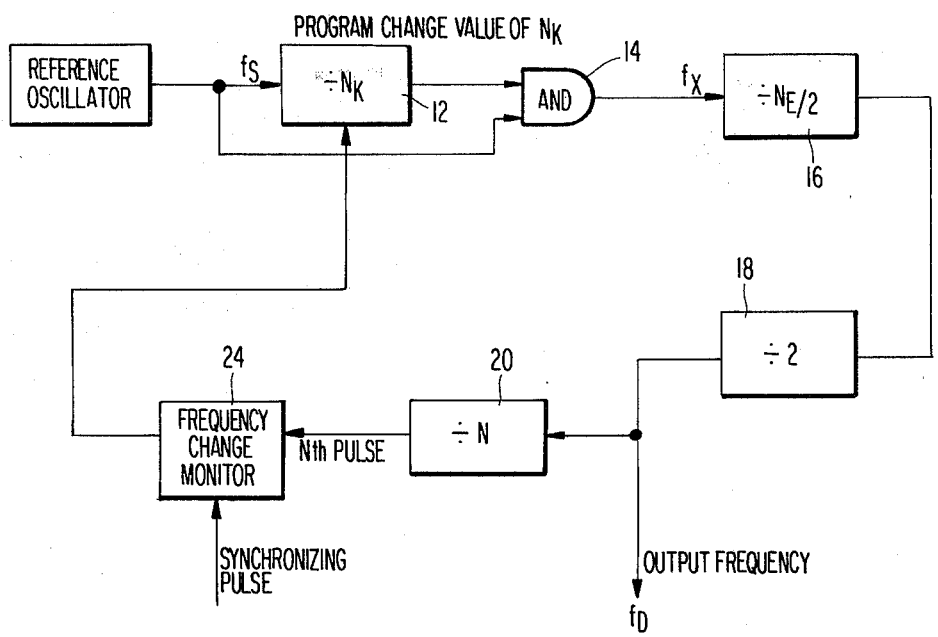
FIG. 5 is a block diagram showing a second embodiment of the phase lock loop in accordance with the present invention.

Referring now to FIGS. 4 and 5, a second embodiment of this invention is shown in which the synchronizing pulse appears after a fixed time interval, that is after the time base. The time base is used for generating frequency in accordance with the formula frequency $(f)$ = no. of bits in time base $(N)$/time base $(T)$ This can also be expressed as $$N = F \cdot T$$

The program synthesized frequency, that is, the slave frequency, can then be applied to a counter to count up to N. This counter is synchronized by the fixed time base pulse. The Nth bit is divided into three components, as shown in FIG. 4. These components are positioned relative to the synchronizing pulses which are shown in the bottom of the figure. The first is the component dealing with the first half of the Nth pulse from the leading edge to the center of the synchronizing pulse. The second component would be the second half of the Nth pulse from the edge of the synchronizing pulse to the trailing edge of the Nth pulse. Finally, at the exact center frequency about the synchronizing pulse, the third component is shown.

Accordingly, if the synchronizing pulse appears in the shaded area shown in waveform (d) of FIG. 4, then it is apparent that no change is needed since the Nth bit is centered about the synchronizing pulse. If the synchronizing pulse appears in the shaded area of waveform (b), but not in the portion of the shaded area of (d), the slave frequency is lower. Conversely, if the synchronizing pulse appears in the shaded area of waveform (c) of FIG. 4, but not in the shaded area of waveform (d), the slave frequency is higher.

Given this status, the second embodiment of FIG. 5 can be shown.

The elements of FIG. 5, which are the same as those in FIG. 3, have been consistently labeled and will not be discussed in detail. As shown, in FIG. 5, the error detector and program changer is used to compare the synchronizing pulse with the Nth pulse delivered from divider 20. Based on the discussion of the timing chart in FIG. 4, a correction to $N_k$ is made, depending on the relationship between the frequency of the component of the Nth pulse and the synchronizing pulse. As in the prior example, the Nth pulse is used to load the counter 20 such that it counts to a specific fixed number. Also, it should be noted that the output in the form of the symmetrical desired output frequency $f_D$ is used to provide the input to the counter 20 to close the loop.

As seen, this technique is useful where every fraction of a frequency can be adjusted and the output frequency will be edge synchronous with the incoming frequency. In the case of repetitive time base pulses, such as a satellite frame pulse of variable width, the TIM clock frequency will lock onto it. Therefore, satellite doppler and reference oscillator stability effects are corrected in this system to maintain synchronous operation.

It is apparent that modifications of this system can be achieved without departing from the essential scope of the invention.

What is claimed is:

1. A digital phase-lock loop for effecting programmed changes in the desired output frequency $f_D$ of a frequency synthesizer, said output frequency being derived from a reference frequency $f_S$ comprising; means defining a synchronizing pulse occurring at a first frequency representative of a predetermined period of a master frequency, means defining a second frequency representative of said output frequency, means for counting bits of said output frequency occurring between a one synchronizing pulse and a subsequent synchronizing pulse to a fixed number and providing an output pulse, and a frequency change monitor to compare the correlation of the output pulse with a synchronizing pulse, and to effect a programmed frequency change of said output frequency $f_D$ in said means defining a second frequency in accordance with a predetermined digital logic relationship if and only if, said second frequency differs from said first frequency.

2. The phase lock loop of claim 1, wherein said frequency change monitor comprises a first flip-flop element producing a first logic correction output signal representative of a high signal for a second frequency higher than said first frequency and a low signal for a second frequency lower than or equal to said first frequency.

3. The phase lock loop of claim 2, wherein said frequency change monitor further comprises a second flip-flop element producing a second logic correction output signal representative of a high signal for a second frequency lower than said first frequency and a low signal for a second frequency higher than or the equal to said first frequency.

4. The phase lock loop of claim 3, wherein said frequency change monitor produces a third logic correction output signal representative of a one signal for equal frequency comparison and an opposite signal for an unequal comparison indicating different first and second frequencies.

5. A digital phase-lock loop for a frequency synthesizer producing a output frequency $f_D$ comprising; means producing an output pulse train having a clock frequency $f_S$, a programmable divider receiving an input signal that is a function of $f_S$ and dividing said input signal by a number $N_k$ which is determined in accordance with:

$(N_E + N_R)/N_R$ where, $N_E$ is an even number, preferably highest without exceeding $f_S/f_D$, and $N_R$ is equal to the remainder of $(f_S/f_D) - N_E$, either a whole number or fraction but not a negative quantity, to produce an output $f_x$, where $f_x$ is an even multiple of $f_D$, a second divider receiving the signal $f_D$, and performing a division thereon by a predetermined fixed number and providing a first output indicative of the number of bits counted during a first time base, means providing a second output representative of the number of bits counted during a second time base representative of a master frequency and comparator means receiving said first and second outputs and generating a correction signal which is applied to said programmable divider to adjust the value of $N_k$ to synchronize $f_D$ with the master frequency.

6. The phase lock loop of claim 5, wherein said second time base is defined by a synchronizing pulse input to said comparator means.

7. The phase lock loop of claim 5, wherein said second time base is defined by means of a third divider dividing said master frequency by some predetermined number.

8. The phase lock loop of claim 7, further comprising logic means receiving said first and second outputs and providing a correction signal to said programmable divider to adjust $N_k$ causing the output frequency to synchronize with the master frequency.

* * * * *

UNITED STATES PATENT AND TRADEMARK OFFICE
CERTIFICATE OF CORRECTION

PATENT NO. : 4,354,164
DATED : October 12, 1982
INVENTOR(S) : Shanti Gupta

It is certified that error appears in the above—identified patent and that said Letters Patent is hereby corrected as shown below:

Column 3, line 22, between equations (7) and (8) insert -- or --;

Column 4, line 3, change "8" to -- 18 --.

Signed and Sealed this

Fifteenth Day of February 1983

[SEAL]

Attest:

Attesting Officer

GERALD J. MOSSINGHOFF

Commissioner of Patents and Trademarks